United States Patent
Hidaka

(10) Patent No.: US 9,603,250 B2
(45) Date of Patent: Mar. 21, 2017

(54) ELECTROMAGNETIC FIELD MANIPULATION AROUND VIAS

(71) Applicant: FUJITSU LIMITED, Kawasaki-shi, Kanagawa (JP)

(72) Inventor: Yasuo Hidaka, Cupertino, CA (US)

(73) Assignee: FUJITSU LIMITED, Kawasaki (JP)

( * ) Notice: Subject to any disclaimer, the term of this patent is extended or adjusted under 35 U.S.C. 154(b) by 329 days.

(21) Appl. No.: 14/194,278

(22) Filed: Feb. 28, 2014

(65) Prior Publication Data
US 2015/0250055 A1    Sep. 3, 2015

(51) Int. Cl.
| | |
|---|---|
| H05K 1/11 | (2006.01) |
| H05K 3/46 | (2006.01) |
| H05K 1/02 | (2006.01) |
| H05K 3/00 | (2006.01) |
| H05K 3/42 | (2006.01) |

(52) U.S. Cl.
CPC ........... *H05K 1/116* (2013.01); *H05K 1/0251* (2013.01); *H05K 1/0225* (2013.01); *H05K 3/0047* (2013.01); *H05K 3/429* (2013.01); *H05K 2201/093* (2013.01); *H05K 2201/096* (2013.01); *H05K 2201/09618* (2013.01); *H05K 2201/09718* (2013.01); *H05K 2201/09727* (2013.01); *H05K 2201/09845* (2013.01); *Y10T 29/49165* (2015.01)

(58) Field of Classification Search
CPC ....... H05K 1/115; H05K 1/116; H05K 1/0298
USPC ....................................................... 174/262
See application file for complete search history.

(56) References Cited

U.S. PATENT DOCUMENTS

| | | | | |
|---|---|---|---|---|
| 5,397,862 A * | 3/1995 | Bockelman | ....... | H01L 23/49838 174/250 |
| 2006/0151869 A1* | 7/2006 | Gisin | ................ | H01L 23/49827 257/698 |
| 2006/0226533 A1* | 10/2006 | Jiang | ................. | H01L 23/49827 257/698 |
| 2009/0015345 A1* | 1/2009 | Kushta | .................. | H05K 1/0251 333/34 |
| 2009/0056999 A1* | 3/2009 | Kashiwakura | ....... | H05K 1/0251 174/262 |
| 2013/0214397 A1* | 8/2013 | Kawai | .................. | H05K 1/0245 257/664 |

* cited by examiner

*Primary Examiner* — Hoa C Nguyen
*Assistant Examiner* — Amol Patel
(74) *Attorney, Agent, or Firm* — Maschoff Brennan

(57) ABSTRACT

A circuit may include a signal path, a first layer including the signal path, and a second layer including the signal path. The circuit may additionally include a path via having a signal-path via location and configured to connect the signal path at the first layer with the signal path at the second layer. The circuit may also include a ground plane associated with the first layer. The ground plane may have a ground-plane location that corresponds to the signal-path via location. The ground plane may also include an asymmetrical cutout portion that extends away from the ground-plane location on a first side of the ground plane that is opposite a second side of the ground plane that corresponds with a side of the first layer where the path via interfaces with the signal path at the first layer.

20 Claims, 6 Drawing Sheets

ELECTROMAGNETIC FIELD MANIPULATION AROUND VIAS

FIELD

The embodiments discussed herein are related to manipulating electromagnetic fields around vias.

BACKGROUND

Vias may be used to electrically connect conductors in different layers of circuit boards and integrated circuits. An electrical signal typically runs horizontally on a layer and then upon reaching a via makes a sharp (e.g., 90°) turn and runs vertically to be carried to a different layer, where the electrical signal may make another sharp turn to resume running horizontally. The sharp turns between running horizontally and vertically may create an impedance discontinuity that may result in reflections and degradation of the electrical signal.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of an embodiment, a circuit configured to reduce electrical signal degradation may include a signal path configured to carry a forward current of an electrical signal, a first layer that includes the signal path, and a second layer that includes the signal path. The circuit may additionally include a path via having a signal-path via location and configured to connect the signal path at the first layer with the signal path at the second layer. The circuit may also include a ground plane associated with the first layer and configured to carry a return current of the electrical signal. The ground plane may have a ground-plane location that corresponds to the signal-path via location. The ground plane may also include an asymmetrical cutout portion that extends away from the ground-plane location on a first side of the ground plane that is opposite a second side of the ground plane that corresponds with a side of the first layer where the path via interfaces with the signal path at the first layer.

The object and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DESCRIPTION OF EMBODIMENTS

As explained in detail below, a circuit may be configured to reduce signal degradation that may be associated with electrical signals (referred to hereinafter as "signals") making a sharp (e.g., 90°) turn upon entering and exiting a via from and to different layers of the circuit. In some instances, the signal degradation may be caused by an impedance discontinuity that may occur at the corners where the via may interface with the layers of the circuit. The impedance discontinuity may be caused, at least in part, by disruption of an electro-magnetic (EM) field associated with the signals.

For example, when a signal is propagating along its signal path in a layer, the corresponding EM field may be in a Transverse Electro-Magnetic (TEM) mode where the electric field and the magnetic field of the EM field are both substantially perpendicular to the direction of propagation of the signal. However, when the signal reaches a sharp corner (e.g., at a via), the abrupt change in direction may cause the EM field on the inside of the corner to have a shorter propagation distance than the EM field on the outside of the corner. The discontinuity between the propagation distances may cause the corresponding EM field to no longer be in TEM mode, which may in turn cause an impedance discontinuity and associated reflections.

In some embodiments, a circuit may be configured such that the EM coupling between a signal path of the circuit and a ground plane of the circuit may be manipulated. The manipulation of the EM coupling may result in the EM coupling being increased on the inside portion of a corner of the signal path with respect to the outside portion of the corner, which may reduce the discontinuity between the EM field directions and allow for the EM field of the signal to be in more of a TEM mode at the corner than without the EM coupling manipulation. Accordingly, the impedance discontinuity and associated degradation of the signal may be reduced. As detailed below, the EM coupling may be manipulated by configuring the sizes and shapes of the signal path as well as cut outs associated with ground planes around areas of the circuit that may include a via. Additionally, in some embodiments the circuit may include additional vias that may help manipulate the EM coupling in a desired manner.

Embodiments of the present disclosure will be explained with reference to the accompanying drawings.

Figure 1A:
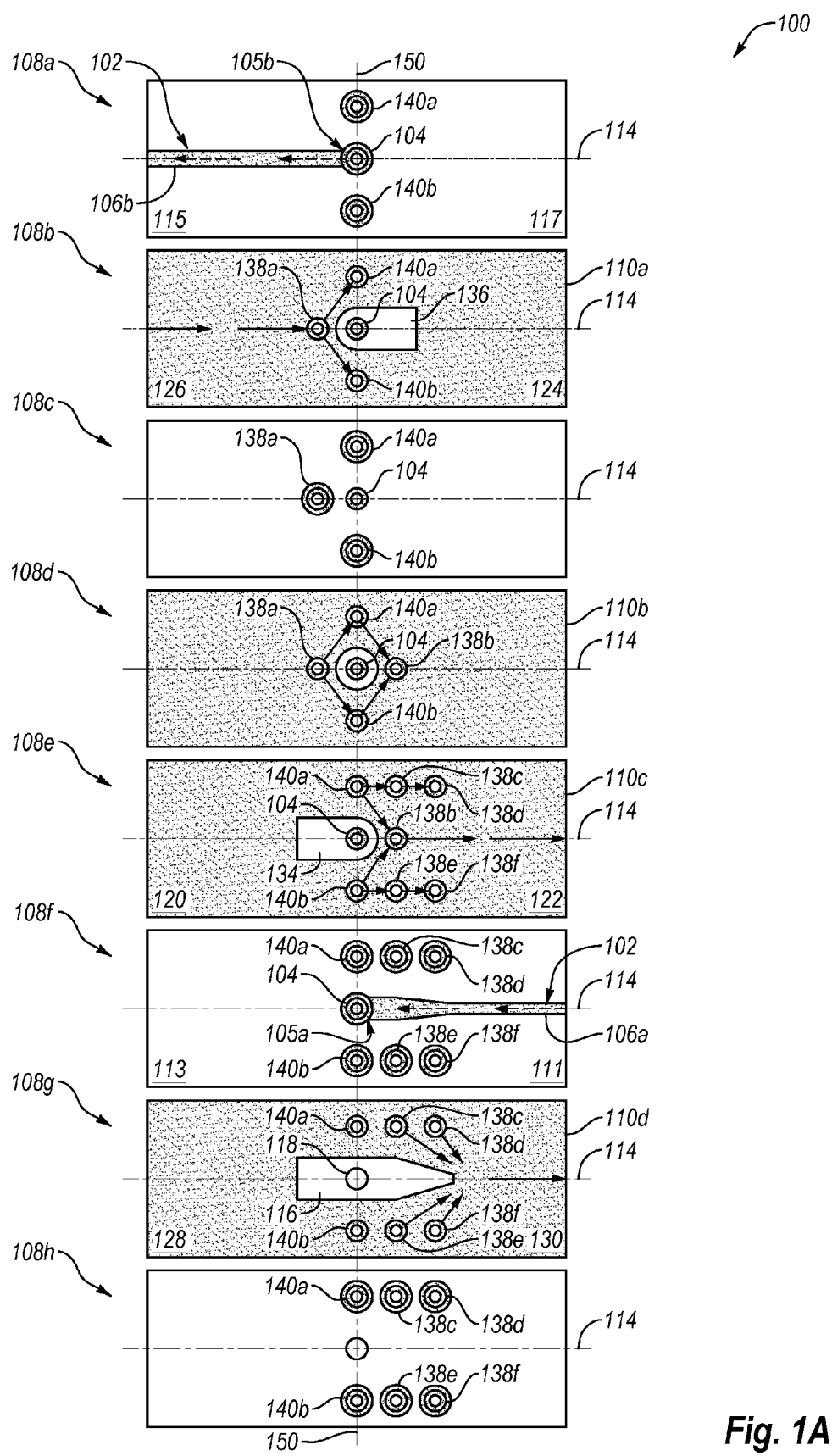
FIG. 1A illustrates an example configuration of a circuit configured to manipulate electro-magnetic (EM) fields.

FIG. 1A illustrates an example configuration of a circuit 100 configured to manipulate EM fields and reduce electrical signal degradation, according to at least one embodiment disclosed herein. The circuit 100 may be a layered circuit such as a Printed Circuit Board (PCB) or an Integrated Circuit (IC) or an IC Package that may include more than one layer. The layers of the circuit 100 may be stacked on top of each other. In FIG. 1A, a top view of each of the layers 108a-108h of the circuit 100 is depicted. Although they are depicted as being side by side in FIG. 1A, the layers 108a-108h may be stacked on top of each other with the layer 108h being at the bottom, followed by the layers 108g, 108*f*, 108*e*, 108*d*, 108*c*, 108*b*, and 108*a*, in that order. The number of layers of the circuit 100 is merely an example and a circuit configured according to the present disclosure may have any number of applicable layers.

The circuit 100 may include a signal path 102 that may be configured to carry an electrical current. In the illustrated embodiment, the signal path 102 may be configured to carry a forward current associated with a signal. The forward current is depicted by dashed arrows within the signal path 102. In the illustrated embodiment, the signal path 102 may include a trace 106*b* associated with the layer 108*a* that may be in, on, and/or supported by the layer 108*a*. The signal path 102 may also include a trace 106*a* associated with the layer 108*f* that may be in, on, and/or supported by the layer 108*f*. The traces 106*b* and 106*a* may be made out of any suitable conductor that may carry an electrical current.

The signal path 102 may also include a path via 104 coupled to the trace 106*b* of the layer 108*a* and the trace 106*a* of the layer 108*f*. The path via 104 may be made out of any suitable conductor such that the forward current may pass between the traces 106*b* and 106*a* through the path via 104. Accordingly, the path via 104 may be configured to electrically connect the signal path 102 at the layer 108*f* and the layer 108*a*.

The interfaces between the path via 104 and the traces 106*b* and 106*a* may be such that the signal path 102 may include substantially sharp corners (e.g., 90°) where the signal may make a substantially sharp turn when entering and exiting the path via 104. In the illustrated embodiment, the interface of the path via 104 with the trace 106*a* may be referred to as a corner 105*a* of the signal path 102 and the interface of the path via 104 with the trace 106*b* may be referred to as a corner 105*b* of the signal path 102.

The side of the layer 108*f* where the path via 104 interfaces with the trace 106*a* may be referred to as an interface side 111 of the layer 108*f*. The side of the layer 108*f* opposite the interface side 111 may be referred to as an opposite-interface side 113 of the layer 108*f*. Similarly, the side of the layer 108*a* where the path via 104 interfaces with the trace 106*b* may be referred to as an interface side 115 of the layer 108*a*. The side of the layer 108*a* opposite the interface side 115 may be referred to as an opposite-interface side 117 of the layer 108*a*. A division line 150 that runs through the middle of the path via 104 as illustrated is used to depict the division between the different sides of the layers 108 as described. As detailed below, the circuit 100 may be configured such that impedance mismatches at the corners 105 may be reduced to reduce degradation of the electrical signal.

One or more of the layers of the circuit 100 may also be configured as ground planes where one or more of the ground planes may be configured to carry a return current of the electrical signal that may correspond to the forward current carried by the signal path 102. The return current is depicted by solid arrows in FIG. 1A. The terms "forward current" and "return current" do not necessarily correspond to any specific directions of current, but are merely used to denote that they may propagate in opposite directions with respect to each other.

In the illustrated embodiment, the layers 108*b*, 108*d*, 108*e*, and 108*g* may be configured as ground planes and may be referred to as ground planes 110*a*, 110*b*, 110*c*, and 110*d*, respectively. The ground planes 110*a*, 110*b*, 110*c*, and 110*d* may include any suitable type of conductor that may cover a substantial portion of their respective layers such that current may pass through the ground planes 110*a*, 110*b*, 110*c*, and 110*d*.

When the signal is passing through the signal path 102, such that the forward current is passing through the signal path 102 and the corresponding return current is passing through the associated ground planes, the conductors of the signal path 102 and the ground planes may have an EM coupling between each other that may affect the EM fields associated with the signal. As detailed below, the conductors associated with the signal path 102 may be configured such that the EM coupling between the conductors allows for the EM fields associated with the signal to be in more of a TEM mode than with conventional implementations at corners where vias interface with traces of signal paths.

For example, the trace 106*a* and the path via 104 may each be electromagnetically coupled with the ground plane 110*c* and the ground plane 110*d*. The circuit 100 may be configured such that the EM coupling of the trace 106*a* with the ground plane 110*c* may increase with respect to the EM coupling of the trace 106*a* with the ground plane 110*d* the closer that the trace 106*a* is to the first corner 105*a* of the signal path 102. In these or other embodiments, the ground plane 110*d* may be configured such that the EM coupling between the path via 104 and the ground plane 110*d* may be reduced. Further, the ground plane 110*c* may be configured such that the EM coupling between the ground plane 110*c* and the path via 104 on a first side 120 of the ground plane 110*c* that is opposite the interface side 111 of the layer 108*f* is reduced as compared to the corresponding EM coupling on a second side 122 of the ground plane 110*c* that corresponds to the interface side 111 of the layer 108*f*. Similarly, the ground plane 110*c* may be configured such that the EM coupling between the ground plane 110*c* and the trace 106*a* on the first side 120 of the ground plane 110*c* is reduced as compared to the corresponding EM coupling on the second side 122 of the ground plane 110*c*.

As another example, the trace 106*b* and the path via 104 may also each be electromagnetically coupled to the ground plane 110*a*. The ground plane 110*a* may be configured such that the EM coupling between the ground plane 110*a* and the path via 104 on a first side 124 of the ground plane 110*a* that is opposite the interface side 115 of the layer 108*a* is reduced as compared to the corresponding EM coupling on a second side 126 of the ground plane 110*a* that corresponds to the interface side 115 of the layer 108*a*. Similarly, the ground plane 110*a* may be configured such that the EM coupling between the ground plane 110*a* and the trace 106*b* on the first side 124 of the ground plane 110*a* is reduced as compared to the corresponding EM coupling on the second side 126 of the ground plane 110*a*.

The configurations described above may increase the EM field near the first corner 105*a* on the inside of the first corner 105*a* with respect to the EM field near the first corner 105*a* on the outside of the first corner 105*a*. Similarly, the configurations described above may increase the EM field near the second corner 105*b* on the inside of the second corner 105*b* with respect to the EM field near the second corner on the outside of the second corner 105*b*. As mentioned above, the increase in the EM fields on the inside of the corners 105 with respect to the EM fields on the outside of the corners 105 may reduce impedance discontinuities at the corners 105, which may reduce degradation of the signal.

Figure 1B:
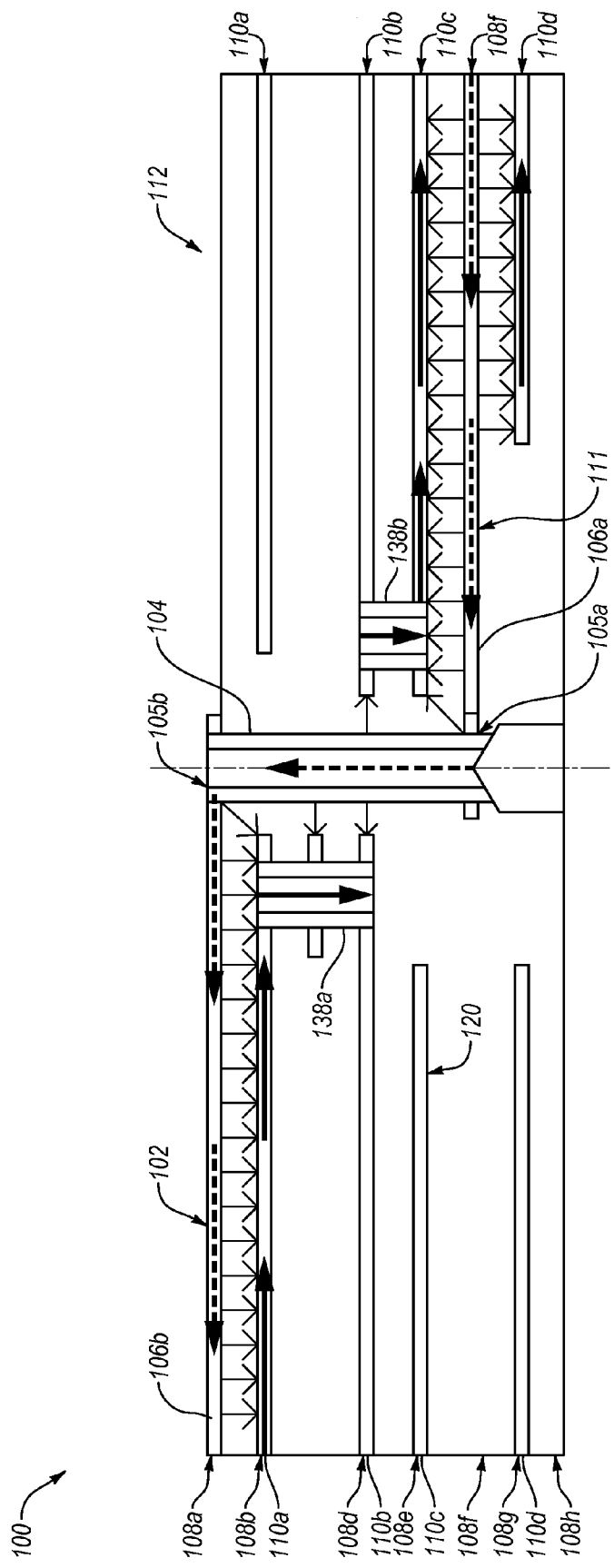
FIG. 1B illustrates an example cross-section of the circuit of FIG. 1A.

FIG. 1B illustrates an example cross-section 112 of the circuit 100 as taken at a line 114 of FIG. 1A, according to at least one embodiment described herein. The thick solid arrows in FIG. 1B indicate the return current of the signal and the thick dashed arrows may indicate the forward current of the signal that may propagate along the signal path 102. The thin arrows in the cross-section 112 indicate the electric fields of the EM fields that may be associated with the signal that may propagate along the signal path 102. The magnetic fields associated with the EM fields may also be present, but are not explicitly illustrated in FIG. 1B.

As illustrated in the cross-section 112 by the electric field arrows, as the trace 106a gets closer to the path via 104 and the corner 105a, the EM coupling manipulation described above may be such that the EM field between the trace 106a and the ground plane 110d may be reduced or eliminated while the EM field between the trace 106a and the ground plane 110c may be maintained or increased. Additionally, the EM coupling manipulation described above may be such that the EM field between the path via 104 and the ground plane 110d may be reduced or eliminated on both sides of the path via 104. Further, the EM field between the path via 104 and the ground plane 110c on the first side 120 of the ground plane 110c (which may be opposite the interface side 111 of the layer 108f) may also be reduced or eliminated. Accordingly, the EM field on the outside of the first corner 105a may be reduced or eliminated and/or the electric field on the inside of the first corner 105a may be increased.

Additionally, as illustrated in the cross-section 112 by the electric field arrows, the ground plane 110a may be similarly configured such that the EM field on the outside of the second corner 105b may be reduced with respect to the EM field on the inside of the second corner 105b, as depicted in FIG. 1B. The manipulation of the EM fields as illustrated may allow for the EM fields to maintain more of a TEM mode at the first corner 105a and the second corner 105b. The TEM mode may be better maintained because the majority, if not all, of the respective EM fields may be on the inside of the first and second corners 105a and 105b. Therefore, differences between the propagating distance of the EM fields at the outsides of the first and second corners 105a and 105b and the propagating distance at the insides of the first and second corners 105a and 105b may cause less interference because a dominant portion, if not all, of the EM fields may be on the insides of the first and second corners 105a and 105b.

Figure 1C:
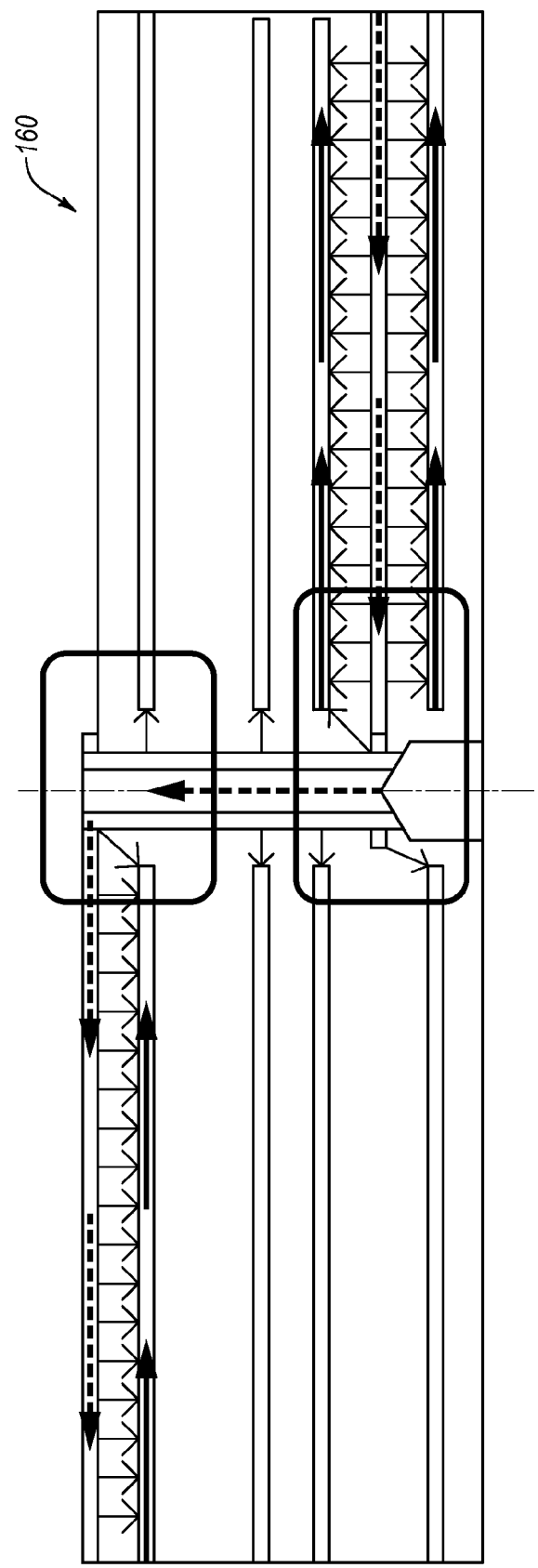
FIG. 1C illustrates an example cross-section of a circuit similar to the circuit of FIGS. 1A and 1B, except without EM field manipulation.

In contrast, FIG. 1C illustrates an example cross-section 160 of a circuit similar to the circuit 100, except without the EM coupling and EM field manipulation described above. As illustrated by the circled portions of the cross-section 160 and a comparison of corresponding locations in the cross-section 112 of FIG. 1B, the EM fields in the circled portions of the cross-section 160 may have propagating distance disparities between the insides and outsides of the corners associated with path via and trace interfaces, which may cause the EM fields to be in less of a TEM mode than those with respect to FIG. 1B.

Returning to FIG. 1A, the EM coupling and field manipulation described above may be accomplished by manipulating the sizes, shapes, and/or locations of the conductors associated with the traces 106 and/or the ground planes 110. For example, in some embodiments, the ground plane 110d may include a cutout portion 116 where the conductor associated with the ground plane 110d may be omitted. The ground plane 110d may include a ground plane location 118 that may be below (e.g., directly below) the path via 104 such that the ground plane location 118 may correspond with the location of the path via 104. In some embodiments, the cutout portion 116 may be configured to extend away from the ground plane location 118 on a first side 128 of the ground plane 110d that may be opposite the interface side 111 of the layer 108f. The extension of the cutout portion 116 away from the ground plane location 118 on the first side 128 may reduce the EM coupling (and consequently the EM field) between the ground plane 110d and the path via 104 on the outside of the corner 105a, such as illustrated in a comparison between FIGS. 1B and 1C.

In these or other embodiments, the cutout portion 116 may be configured to extend away from the ground plane location 118 on a second side 130 of the ground plane 110d that may correspond with the interface side 111 of the layer 108f. The extension of the cutout portion 116 away from the ground plane location 118 on the second side 130 may reduce the EM coupling (and consequently the EM field) between the ground plane 110d and the trace 106a as the trace 106a gets closer to the corner 105a.

In some embodiments, the cutout portion 116 may be configured to be tapered in a manner illustrated in FIG. 1A. Accordingly, in some embodiments, the cutout portion 116 may be asymmetrical and may be wider at the ground plane location 118 than at a terminating location on the second side 130 where the cutout portion 116 may end. The tapering may allow for the EM coupling between the trace 106a and the ground plan 110d to get progressively smaller instead of being abrupt. The extension of the cutout portion on the first side 128 of the ground plane 110d may also reduce the EM coupling (and consequently the EM field) between the ground plane 110d and the trace 106a on the outside of the corner 105a, such as illustrated in a comparison between FIGS. 1B and 1C.

Additionally, in some embodiments, the trace 106a (and consequently the signal path 102) may be configured to widen as the trace 106a approaches the path via 104 and corner 105a such that the trace 106a may be wider at the interface with the path via 104 than at a point further away from the path via 104. The widening of the trace 106a, as well as the presence of the cutout portion 116, may increase the EM coupling (and consequently the EM field) between the trace 106a and the ground plane 110c. Accordingly, the widening of the trace 106a and the cutout portion 116 may increase the EM coupling on the inside of the corner 105a with respect to the EM coupling on the outside of the corner 105a. The width and taper of the cutout portion 116 on the second side 130 of the ground plane 110d and the varying width of the trace 106a may be selected such that the characteristic impedance at the widened portion of the trace 106a may be substantially similar to that of the trace 106a at a portion that is not widened and/or has no cutout portion 116 on the ground plane 110d.

In some embodiments, the ground plane 110c may also include a cutout portion 134 that may be an anti-pad associated with the path via 104. The cutout portion 134 may be asymmetrical such that the cutout portion 134 may be configured as an asymmetrical anti-pad that is larger on the first side 120 of the ground plane 110c that is opposite the interface side 111 of the layer 108f than on the second side 122 of the ground plane 110c that may correspond to the interface side 111 of the layer 108f. The cutout portion 134 may help to decrease EM coupling near the corner 105a on the outside of the corner 105a.

In these or other embodiments, the ground plane 110a may include a cutout portion 136 that may be an anti-pad associated with the path via 104 similar to the cutout portion 134. The cutout portion 136 may be asymmetrical such that the cutout portion 136 may be configured as an asymmetrical anti-pad that is larger on the first side 124 of the ground plane 110a that is opposite the interface side 115 of the layer 108a than on the second side 126 of the ground plane 110a that may correspond to the interface side 115 of the layer 108a. The cutout portion 136 may help to decrease EM coupling near the second corner 105b on the outside of the second corner 105b.

The circuit 100 may also include ground vias configured to carry the return current between ground planes 110. In the illustrated embodiment, the circuit 100 may include ground vias 140a and 140b that may be aligned with the path via 104 along the line 150 as illustrated in FIG. 1A. The ground vias 140a and 140b may be configured in a traditional configuration of ground vias. Additionally, in some embodiments, to help to increase the EM fields on the insides of the corners 105, one or more ground vias 138 may be associated with one of the corners 105 and may be included on the inside of their associated corner 105 near the area of the circuit 100 where their associated corner 105 is located. The ground vias 138 may be configured such that an increased portion of the return current may propagate on the inside of their associated corner 105 as compared to if the ground vias 140a and 140b were solely used. The increased return current on the insides of the corners 105 from the ground vias 138 may help to increase the EM fields on the insides of the corners 105 as compared to the EM fields on the outsides of the corners 105, which may reduce signal degradation.

For example, in the illustrated embodiment, the circuit 100 may include a ground via 138a configured to couple the ground plane 110a with the ground plane 110b such that at least a portion of the return current may pass through the ground via 138a from the ground plane 110a to the ground plane 110b. The ground via 138a may be coupled to the ground plane 110a on the second side 126 of the ground plane 110a in a manner illustrated in FIG. 1A such that the ground via 138a may be substantially inside the corner 105b. Accordingly, the return current passing through the ground via 138a and the forward current passing through the path via 104 may generate an EM field between the ground via 138a and the path via 104 between the ground planes 110a and 110b—which may increase the EM field on the inside of the corner 105b as compared to the outside of the corner 105b. FIG. 1B illustrates an example of the electric field between the path via 104 and the ground via 138a.

As another example, in the illustrated embodiment the circuit 100 may include a ground via 138b configured to couple the ground plane 110b with the ground plane 110c such that at least a portion of the return current may pass through the ground via 138b from the ground plane 110b to the ground plane 110c. The ground via 138b may be coupled to the ground plane 110c on the second side 122 of the ground plane 110c in a manner illustrated in FIG. 1A such that the ground via 138b may be substantially inside the corner 105a. Accordingly, the return current passing through the ground via 138b and the forward current passing through the path via 104 may generate an EM field between the ground via 138b and the path via 104 between the ground planes 110b and 110c—which may increase the EM field on the inside of the corner 105a as compared to the outside of the corner 105a. FIG. 1B illustrates an example of the electric field between the path via 104 and the ground via 138b.

Further, in some embodiments, the circuit 100 may include ground vias 138c, 138d, 138e, and 138f that may be configured to couple the ground plane 110c with the ground plane 110d such that the return current may pass through the ground vias 138c-138f from the ground plane 110c to the ground plane 110d. As illustrated in FIG. 1A, the ground vias 138c-138f may be coupled to the ground plane 110c on the second side 122 of the ground plane 110c and may also be coupled to the ground plane 110d on the second side 130 of the ground plane 110d. Accordingly, the ground vias 138c-138f may be on the inside of the corner 105a near the corner 105a such that corresponding EM fields may be generated on the inside of the corner 105a.

The circuit 100 may accordingly be configured in the manner described such that impedance discontinuities and corresponding signal degradation associated with a signal passing through vias may be reduced. Modifications may be made to the circuit 100 without departing from the scope of the present disclosure. For example, the specific layout and configuration of the circuit 100 is merely used as an example. The number and location of vias (path or ground) may vary depending on specific applications. Further, the number of layers of a circuit may vary as well as which layers may be connected by vias. Further, a circuit may not necessarily implement all of the EM field manipulation techniques disclosed herein.

Figure 2:
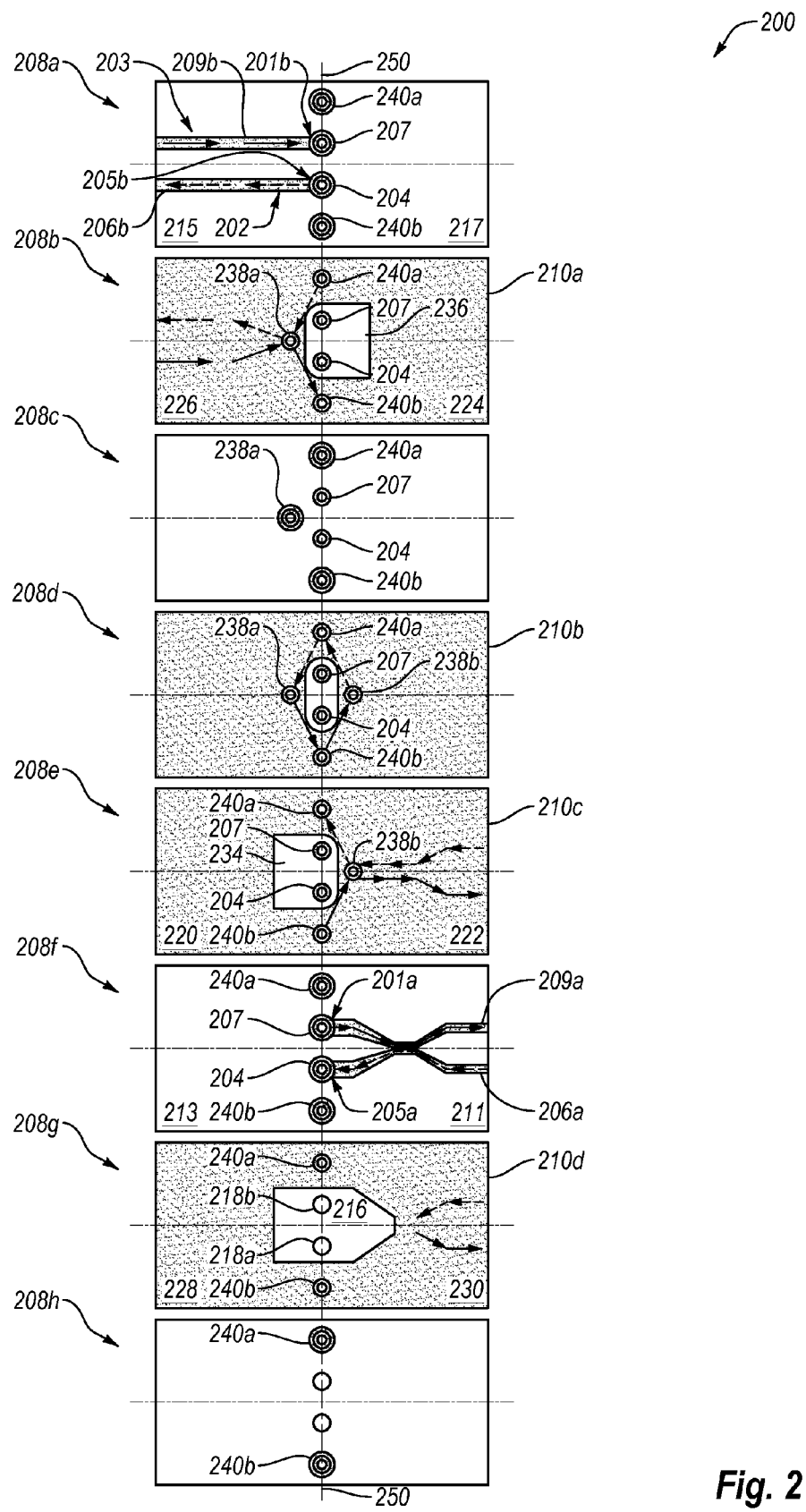
FIG. 2 illustrates an example configuration of a circuit configured to manipulate EM fields for a differential-mode of differential signals.

FIG. 2 illustrates an example configuration of a circuit 200 configured to manipulate EM fields for a differential-mode of differential signals, according to at least one embodiment disclosed herein. The circuit 200 may be a layered circuit such as a Printed Circuit Board (PCB) or an Integrated Circuit (IC) or an IC Package that may include more than one layer. The layers of the circuit 200 may be stacked on top of each other. In the illustrated embodiment, a top view of each of layers 208a-208h of the circuit 200 is depicted similar to the top view of the layers 108a-108h of the circuit 100 in FIG. 1A. The number of layers for the circuit 200 is merely an example and a circuit configured according to the present disclosure may have any number of applicable layers.

The circuit 200 may include a signal path 202 and a signal path 203 that may be configured to carry electrical currents. In the illustrated embodiment, the signal path 202 may be configured to carry a forward current associated with a first signal and the signal path 203 may be configured to carry a return current associated with a second signal. The forward current associated with the first signal may be referred to as the "first-signal forward current" and the return current associated with the second signal may be referred to as the "second-signal return current." In the illustrated embodiment, the signal path 202 may include a trace 206b associated with the layer 208a that may be in, on, and/or supported by the layer 208a. The signal path 202 may also include a trace 206a associated with the layer 208f that may be in, on, and/or supported by the layer 208f. Similarly, the signal path 203 may include a trace 209b associated with the layer 208a that may be in, on, and/or supported by the layer 208a. The signal path 203 may also include a trace 209a associated with the layer 208f that may be in, on, and/or supported by the layer 208f. The traces 206a, 206b, 209a, and 209b may be made out of any suitable conductor that may carry an electrical current.

The signal path 202 may also include a path via 204 coupled to the trace 206b of the layer 208a and the trace 206a of the layer 208f. The path via 204 may be made out of any suitable conductor such that the first-signal forward current may pass between the traces 206b and 206a through the path via 204. Accordingly, the path via 204 may be configured to connect the signal path 202 at the layer 208f and the layer 208a. Similarly, the signal path 203 may also include a path via 207 coupled to the trace 209b of the layer 208a and the trace 209a of the layer 208f. The path via 207 may be made out of any suitable conductor such that the second-signal return current may pass between the traces 209a and 209b through the path via 207. Accordingly, the path via 207 may be configured to connect the signal path 203 at the layer 208f and the layer 208a.

The signal path 202 may include a corner 205a where the path via 204 may interface with the trace 206a. Additionally, the signal path 202 may include a corner 205b where the path via 204 may interface with the trace 206b. Similarly, the signal path 203 may include a corner 201a where the path via 207 may interface with the trace 209a. Additionally, the signal path 203 may include a corner 201b where the path via 207 may interface with the trace 209b.

The side of the layer 208f where the path via 204 interfaces with the trace 206a and where the path via 207 interfaces with the trace 209a may be referred to as an interface side 211 of the layer 208f. The side of the layer 208f opposite the interface side 211 may be referred to as an opposite-interface side 213 of the layer 208f. Similarly, the side of the layer 208a where the path via 204 interfaces with the trace 206b and where the path via 207 interfaces with the trace 209b may be referred to as an interface side 215 of the layer 208a. The side of the layer 208a opposite the interface side 215 may be referred to as an opposite-interface side 217 of the layer 208a. A division line 250 that runs through the middle of the path vias 204 and 207 as illustrated is used to depict the division between the different sides of the layers 208 as described. As detailed below, the circuit 200 may be configured such that differential-mode impedance mismatches at the corners 205 and 201 may be reduced to reduce degradation of the differential-mode of the differential signal.

One or more of the layers of the circuit 200 may also be configured as ground planes where one or more of the ground planes may be configured to carry a return current of the first signal, which may correspond to the first-signal forward current, that may be carried by the signal path 202. Additionally, one or more of the ground planes may be configured to carry a forward current of the second signal, which may correspond to the second-signal return current, that may be carried by the signal path 209. The return current associated with the first signal may be referred to as the "first-signal return current" and the forward current associated with the second signal may be referred to as the "second-signal forward current."

In the illustrated embodiment, the layers 208b, 208d, 208e, and 208g may be configured as ground planes and may be referred to as ground planes 210a, 210b, 210c, and 210d, respectively. The ground planes 210a, 210b, 210c, and 210d may include any suitable type of conductor that may cover a substantial portion of their respective layers such that current may pass through the ground planes 210a, 210b, 210c, and 210d.

The circuit 200 may be configured to increase the EM fields near the corners (e.g., 205a and 205b and the corners 201a and 201b) of the circuit 200 on the insides of the corners with respect to the EM fields near the corners on the outsides of the corners similar to that described above with respect to the circuit 100 and FIG. 1. The EM field manipulation described may be accomplished by manipulating the sizes, shapes, and/or locations of the conductors associated with the traces 206, 209, and/or the ground planes 210 in a manner similar to that described above with respect to circuit 100.

For example, in some embodiments, the ground plane 210d may include a cutout portion 216 where the conductor associated with the ground plane 210d may be omitted. The ground plane 210d may include ground plane locations 218a and 218b that may be below the path vias 204 and 207, respectively such that the ground plane locations 218a and 218b may correspond with the locations of the path vias 204 and 207. In some embodiments, the cutout portion 216 may be configured to extend away from the ground plane locations 218a and 218b on a first side 228 of the ground plane 210d that may be opposite the interface side 211 of the layer 208f. The extension of the cutout portion 216 away from the ground plane locations 218a and 218b on the first side 228 may reduce the EM coupling (and consequently the EM field) between the ground plane 210d and the path vias 204 and 207 on the outside of the corners 205a and 201a.

In these or other embodiments, the cutout portion 216 may be configured to extend away from the ground plane locations 218a and 218b on a second side 230 of the ground plane 210d that may correspond with the interface side 211 of the layer 208f. The extension of the cutout portion 216 away from the ground plane locations 218a and 218b on the second side 230 may reduce the EM coupling (and consequently the EM field) between the ground plane 210d and the traces 206a and 209a as the traces 206a and 209a get closer to the corners 205a and 201a, respectively. In some embodiments, the cutout portion 216 may be configured to be tapered in a manner illustrated in FIG. 2. Accordingly, in some embodiments, the cutout portion 216 may be asymmetrical and may be wider at the ground plane location 218 than at a terminating location on the second side 230 where the cutout portion 216 may end.

Additionally, in some embodiments, the traces 206a and 209a may be configured to converge toward each other near the corners 205a and 201a in a manner illustrated in FIG. 2. In some embodiments, the traces 206a and 209a, as they move from the far right side of the interface side 211 toward the corners 205a and 201a, may also be configured to be increasingly narrow as they converge toward each other. The converging and/or the narrowing of the traces 206a and 209a may increase the EM coupling between the traces 206a and 209a such that the EM field between the traces 206a and 209a may increase.

The traces 206a and 209a may also be configured to diverge between the corners 205a and 201a and the area where the traces 206a and 209a converge as illustrated in FIG. 2. In some embodiments, the traces 206a and 209a may be configured to widen as they get closer to the path vias 204 and 207 as they diverge from each other. The configuration of the traces 206a and 209a in this manner as well as the cutout portion 216 in the ground plane 210d may concentrate the EM fields associated with the first-signal forward current and the second-signal return current on the insides of the corners 205a and 201a, respectively. The widening and tapering of the traces 206a and 209a, as well as the spacing between the traces 206a and 209a as they converge and diverge may be selected such that the differential-mode characteristic impedances of the traces 206a and 209a may be substantially similar to that of the traces 206a and 209a where the traces are not widening, tapering, converging, or diverging.

In some embodiments, the ground plane 210c may also include a cutout portion 234 that may be an anti-pad associated with the path vias 204 and 207. The cutout portion 234 may be asymmetrical such that the cutout portion 234 may be configured as an asymmetrical anti-pad that is larger on a first side 220 of the ground plane 210c than on a second side 222 of the ground plane 210c. As illustrated in FIG. 2, the first side 220 may be opposite the interface side 211 of the layer 208f and the second side 222 may correspond to the interface side 211 of the layer 208f. Accordingly, the cutout portion 234 may decrease EM coupling and EM fields near the corners 205a and 201a on the outsides of the corner corners 205a and 201a.

In these or other embodiments, the ground plane 210a may include a cutout portion 236 that may be an anti-pad associated with the path vias 204 and 207 similar to the cutout portion 234 being an anti-pad associated with the path vias 204 and 207. The cutout portion 236 may be asymmetrical such that the cutout portion 236 may be configured as an asymmetrical anti-pad that is larger on a first side 224 of the ground plane 210a than on a second side 226 of the ground plane 210a. As illustrated in FIG. 2, the first side 224 may be opposite the interface side 215 of the layer 208a and the second side 226 may correspond to the interface side 215 of the layer 208a. Accordingly, the cutout portion 236 may decrease EM coupling and EM fields near the corners 205b and 201b on the outsides of the corners 205b and 201b.

In some embodiments, the circuit 200 may include ground vias configured to carry the first-signal return current and the second-signal forward current between ground planes 210. In the illustrated embodiment, the circuit 200 may include ground vias 240a and 240b that may be aligned with the path vias 204 and 207 as illustrated in FIG. 2. The ground vias 240a and 240b may be configured in a traditional configuration of ground vias and may be analogous to the ground vias 140a and 140b of FIG. 1A. Additionally, in some embodiments, to increase the EM fields on the inside of the corners 205a, 205b, 201a, and/or 201b, one or more ground vias 238 may be associated with one or more of the corners 205a, 205b, 201a, and/or 201b and may be included on the inside of their associated corners near the area of the circuit 200 where their associated corners are located. The ground vias 238 may be configured such that increased portions of the first-signal return current and the second-signal forward current may propagate on the insides of their associated corners as compared to if the ground vias 240a and 240b were solely used.

For example, in the illustrated embodiment, the circuit 200 may include ground vias 238a and 238b configured in a manner analogous to the ground vias 138a and 138b of FIG. 1A. Therefore, the ground via 238a may be associated with the corners 201b and 205b and may increase the EM fields on the insides of the corners 201b and 205b. Similarly, the ground via 238b may be associated with the corners 201a and 205a and may increase the EM fields on the insides of the corners 201a and 205a.

The circuit 200 may accordingly be configured in the manner described such that differential-mode impedance discontinuities and corresponding signal degradation associated with the differential-mode of a differential signal passing through vias may be reduced. Modifications may be made to the circuit 200 without departing from the scope of the present disclosure. For example, the specific layout and configuration of the circuit 200 is merely used as an example. The number and location of vias (path or ground) may vary depending on specific applications. Further, the number of layers of a circuit may vary as well as which layers may be connected by vias. Further, a circuit may not necessarily implement all of the EM field manipulation techniques disclosed herein.

Figure 3:
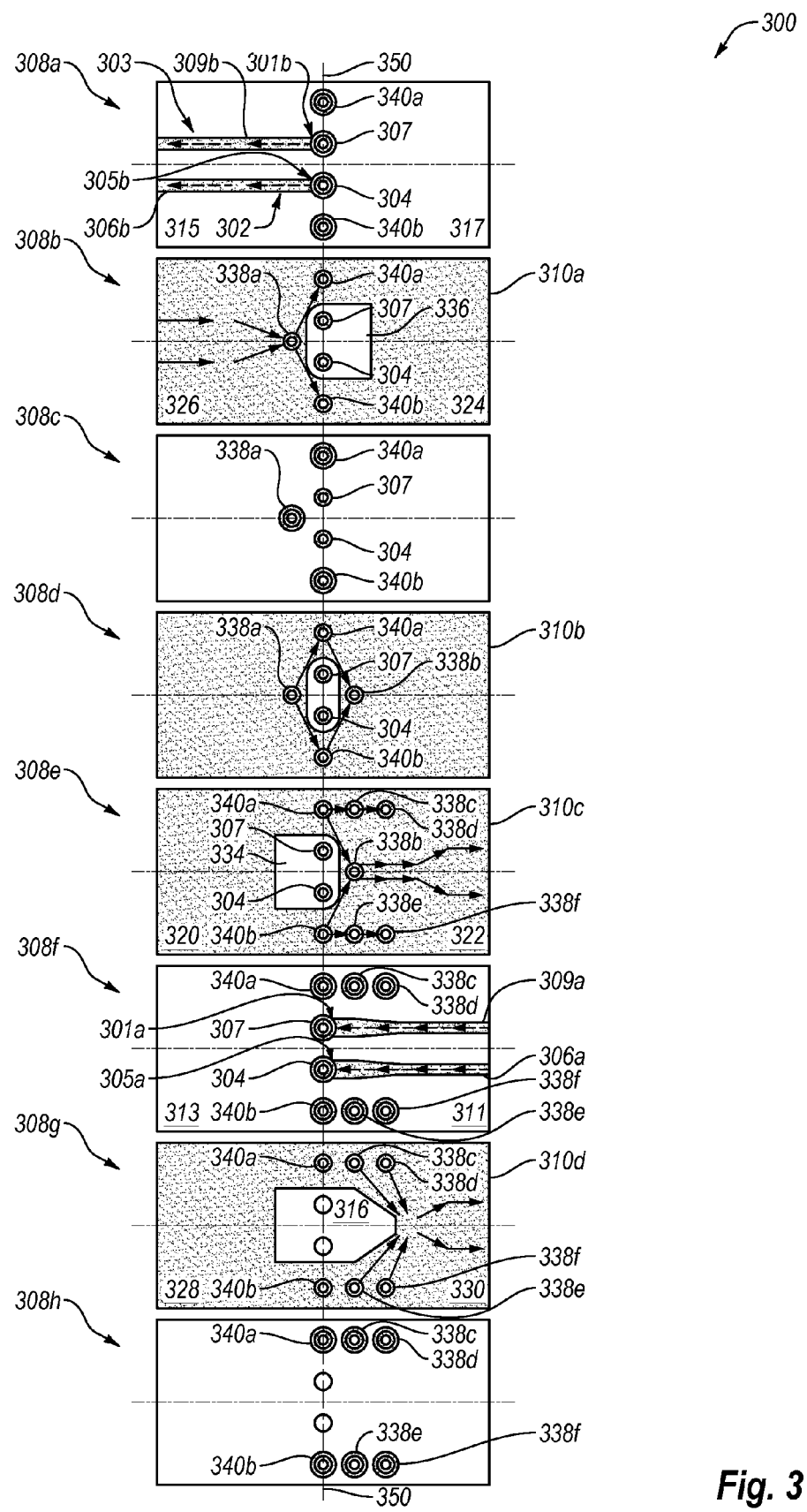
FIG. 3 illustrates an example configuration of a circuit configured to manipulate EM fields for a common-mode of differential signals.

FIG. 3 illustrates an example configuration of a circuit 300 configured to manipulate EM fields and reduce electrical signal degradation for a common-mode of differential signals, according to at least one embodiment disclosed herein. The circuit 300 may be a layered circuit such as a Printed Circuit Board (PCB) or an Integrated Circuit (IC) or an IC Package that may include more than one layer. The layers of the circuit 300 may be stacked on top of each other. In the illustrated embodiment, a top view of layers 308a-308h of the circuit 300 are depicted in a manner similar to the depiction of the layers 108a-108h of the circuit 100 in FIG. 1A. The number of layers for the circuit 300 is merely an example and a circuit configured according to the present disclosure may have any number of applicable layers.

The circuit 300 may include a signal path 302 and a signal path 303 that may be configured to carry electrical currents. In the illustrated embodiment, the signal path 302 may be configured to carry a forward current associated with a first signal and the signal path 303 may be configured to carry a forward current associated with a second signal. The forward current associated with the first signal may be referred to as the "first-signal forward current" and the forward current associated with the second signal may be referred to as the "second-signal return current."

The signal path 302 may be similar to the signal path 202 of FIG. 2 and may include traces 306a and 306b, a path via 304, a corner 305a and a corner 305b, that may be similar to the traces 206a and 206b, the path via 204, the corner 205a, and the corner 205b, respectively, of FIG. 2. The signal path 303 may be similar to the signal path 203 of FIG. 2 and may include traces 309a and 309b, a path via 307, a corner 301a, and a corner 301b that may be similar to the traces 209a and 209b, the path via 207, the corner 201a, and the corner 201b, respectively of FIG. 2. In some embodiments, the traces 306a and 309a may differ from the traces 206a and 209a in that the traces 306a and 309a may not be configured to converge and diverge like the traces 206a and 209a. The circuit 300 may also include ground planes 310a-310d, which may be configured to carry the return currents of the first and second signals.

The circuit 300 may be configured to increase the EM fields near the corners (e.g., 305a and 305b and the corners 301a and 301b) of the circuit 300 on the insides of the corners with respect to the EM fields near the corners on the outsides of the corners similar to that described above with respect to the circuit 200 of FIG. 2 and/or the circuit 100 of FIG. 1A. The EM field manipulation described may be accomplished by manipulating the sizes, shapes, and/or locations of the conductors associated with the traces 306 and 309, and/or the ground planes 310.

For example, the ground plane 310a may include a cutout portion 336, the ground plane 310c may include a cutout portion 334, and the ground plane 310d may include a cutout portion 316 that may be configured in an analogous manner as the cutout portions 236, 234, and 216, respectively, of FIG. 2. Accordingly, the cutout portions 336, 334, and 316 may be configured to increase the EM fields near the corners (e.g., 305a and 305b and the corners 301a and 301b) of the circuit 300 on the insides of the corners with respect to the EM fields near the corners on the outsides of the corners.

Additionally, although the traces 306a and 309a may not be configured to converge in some embodiments, they may be configured to get wider as they approach the corners 305a and 301a, respectively. The widening of the traces 306a and 309a in this manner as well as the cutout portion 316 in the ground plane 310d may concentrate the EM fields associated with the first-signal forward current and the second-signal forward current on the insides of the corners 305a and 301a, respectively.

The circuit 300 may also include ground vias 340a and 340b configured in an analogous manner as the ground vias 140a, 140b, 240a, and 240b of FIGS. 1A and 2, respectively. Additionally, the circuit 300 may include ground vias 338a-338f, which may be configured in an analogous manner as ground vias 138a-138f of FIG. 1A. Accordingly, the ground vias 338a-338f may direct the first-signal return current and the second-signal return current on the insides of their associated corners 305 and 301 such that the EM fields between the first-signal return current and the first signal forward current and between the second-signal return current and the second-signal forward current may be increased on the insides of the corners 305 and 301.

The circuit 300 may accordingly be configured in the manner described and illustrated such that common-mode impedance discontinuities and corresponding signal degradation associated with the common-mode of a differential signal passing through vias may be reduced. Modifications may be made to the circuit 300 without departing from the scope of the present disclosure. For example, the specific layout and configuration of the circuit 300 is merely used as an example. The number and location of vias (path or ground) may vary depending on specific applications. Further, the number of layers of a circuit may vary as well as which layers may be connected by path vias. Further, a circuit may not necessarily implement all of the EM field manipulation techniques disclosed herein.

Figure 4:
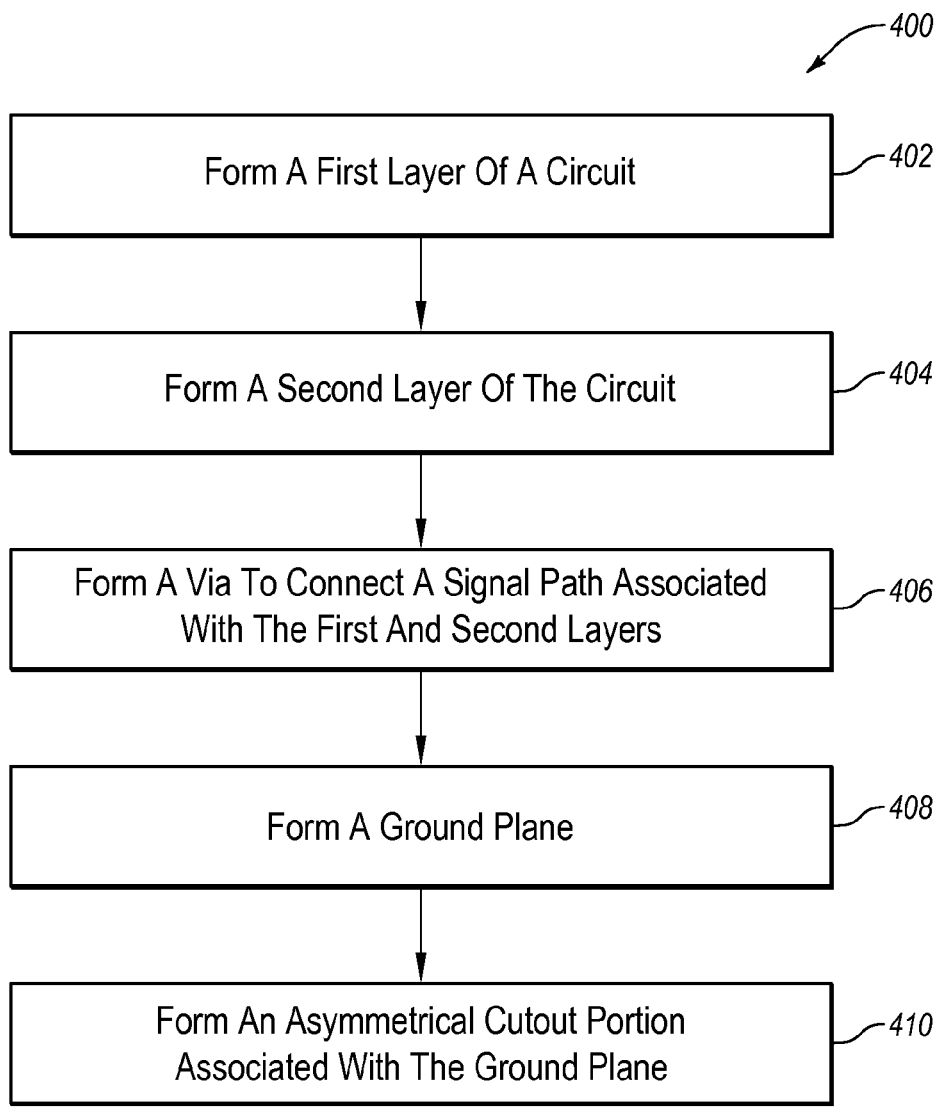
FIG. 4 is a flowchart of an example method of reducing electrical signal degradation in a circuit.

FIG. 4 is a flowchart of an example method 400 of reducing electrical signal degradation in a circuit, arranged in accordance with at least one embodiment described herein. The method 400 may be implemented, in some embodiments, by forming or manufacturing a layered circuit according to the principles described above with respect to circuits 100, 200, and 300 of FIGS. 1A, 2, and 3, respectively. Although illustrated as discrete blocks, various blocks may be divided into additional blocks, combined into fewer blocks, or eliminated, depending on the desired implementation.

The method 400 may begin and at block 402, a first layer of the circuit may be formed. The first layer may be formed to include a signal path configured to carry a forward current of an electrical signal. At block 404, a second layer of the circuit may be formed. The second layer may also be formed to include the signal path. At block 406, a path via configured to connect the signal path at the first layer with the signal path at the second layer may be formed. The path via may have a signal-path via location at the first layer and the second layer. In some embodiments, the signal path may be configured according to any one of the signal paths 102, 202, 203, 302, and 303 described above.

At block 408, a ground plane associated with the first layer and the second layer may be formed. The ground plane may be configured to carry a return current of the electrical signal and may have a ground-plan location that corresponds to the signal-path via location. At block 410, an asymmetrical cutout portion associated with the ground plane may be formed. The asymmetrical cutout portion may be formed to extend away from the ground-plane location on a first side of the ground plane that is opposite a second side of the ground plane that corresponds with a side of the first layer where the path via interfaces with the signal path at the first layer. For example, the asymmetrical cutout portion may be any one of the cutout portions 116, 134, 136, 216, 234, 236, 316, 334, or 336 of the circuits 100, 200, and 300 described above.

Configuring a circuit according to the method 400 may manipulate the EM fields associated with the circuit such as described above with respect to FIGS. 1A, 1B, 2, and 3, which may reduce impedance discontinuities and associated signal degradation. Modifications may be made to the method 400 without departing from the scope of the present disclosure. For example, the order of the steps associated with the blocks may be performed in a different order than that presented. Additionally, in some embodiments, the method 400 may include steps associated with forming and configuring ground vias such as the ground vias 138a-138f, 238a, 238b, and 338a-338f, described above.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present disclosure have been described in detail, it should be understood that the various changes, substitutions, and alterations could be made hereto without departing from the spirit and scope of the invention.

What is claimed is:

1. A circuit configured to reduce electrical signal degradation, the circuit comprising:
   a signal path configured to carry a forward current of an electrical signal;
   a first layer including the signal path;
   a second layer including the signal path;
   a path via having a signal-path via location and configured to connect the signal path at the first layer with the signal path at the second layer; and
   a ground plane adjacent to the first layer and configured to carry a return current of the electrical signal, the ground plane having a ground-plane location that corresponds to the signal-path via location, the ground plane including an asymmetrical cutout portion that extends away from the ground-plane location on a first side of the ground plane that is opposite a second side of the ground plane that corresponds with a side of the first layer where the path via interfaces with the signal path at the first layer.

2. The circuit of claim 1, wherein the signal path includes a widened portion that widens on the first layer as it approaches the signal-path via location.

3. The circuit of claim 2, wherein the widening of the signal path is configured such that its characteristic impedance is approximately the same at the widened portion as at a portion that is not widened.

4. The circuit of claim 1, wherein the asymmetrical cutout portion is an asymmetrical anti-pad associated with the path via, the asymmetrical anti-pad being configured to be larger on the first side of the ground plane than on the second side of the ground plane.

5. The circuit of claim 1, wherein the asymmetrical cutout portion extends away from the ground-plane location on the second side of the ground plane and ends at a terminating location on the second side of the ground plane, the asymmetrical cutout portion being wider at the ground-plane location than at the terminating location.

6. The circuit of claim 5, wherein the asymmetrical cutout portion is tapered on the second side of the ground plane such that the asymmetrical cutout portion is wider at the ground-plane location than at the terminating location.

7. The circuit of claim 6, wherein the signal path is widened on the first layer in a manner that corresponds with the taper of the asymmetrical cutout portion.

8. The circuit of claim 1, wherein the ground plane is a first ground plane, the circuit further comprising:
   a second ground plane; and
   a ground via coupled to the second side of the first ground plane such that the ground via is located on an inside of a corner of the signal path where the signal path interfaces with the path via, the ground via being configured to connect the first ground plane with the second ground plane such that the return current passes between the first ground plane and the second ground plane through the ground via.

9. The circuit of claim 1, wherein the electrical signal is a differential signal including a first signal and a second signal, and the signal path is a differential signal path that includes a first-signal path configured to carry the first signal and a second-signal path configured to carry the second signal, the first-signal path and the second-signal path being configured to converge and diverge.

10. The circuit of claim 9, wherein at least one of the first-signal path and the second-signal path is configured to narrow as the first-signal path and the second-signal path converge.

11. A method to reduce electrical signal degradation, the method comprising:
forming a first layer including a signal path configured to carry a forward current of an electrical signal;
forming a second layer including the signal path;
forming a path via having a signal-path via location and configured to connect the signal path at the first layer with the signal path at the second layer;
forming a ground plane adjacent to the first layer and configured to carry a return current of the electrical signal, the ground plane having a ground-plane location that corresponds to the signal-path via location; and
forming an asymmetrical cutout portion associated with the ground plane, the asymmetrical cutout portion being formed to extend away from the ground-plane location on a first side of the ground plane that is opposite a second side of the ground plane that corresponds with a side of the first layer where the path via interfaces with the signal path at the first layer.

12. The method of claim 11, further comprising forming the signal path such that the signal path includes a widened portion that widens on the first layer as it approaches the signal-path via location.

13. The method of claim 12, further comprising forming the signal path such that the widening of the signal path is configured such that its characteristic impedance is approximately the same at the widened portion as at a portion that is not widened.

14. The method of claim 11, further comprising configuring the asymmetrical cutout portion as an asymmetrical anti-pad associated with the path via, the asymmetrical anti-pad being configured to be larger on the first side of the ground plane than on the second side of the ground plane.

15. The method of claim 11, further comprising configuring the asymmetrical cutout portion such that the asymmetrical cutout portion extends away from the ground-plane location on the second side of the ground plane and ends at a terminating location on the second side of the ground plane, the asymmetrical cutout portion being wider at the ground-plane location than at the terminating location.

16. The method of claim 15, further comprising configuring the asymmetrical cutout portion such that the asymmetrical cutout portion is tapered on the second side of the ground plane such that the asymmetrical cutout portion is wider at the ground-plane location than at the terminating location.

17. The method of claim 16, further comprising configuring the signal path such that the signal path is widened on the first layer in a manner that corresponds with the taper of the asymmetrical cutout portion.

18. The method of claim 11, wherein the ground plane is a first ground plane and the method further comprises:
forming a second ground plane;
forming a ground via coupled to the second side of the first ground plane such that the ground via is located on an inside of a corner of the signal path where the signal path interfaces with the path via; and
configuring the ground via to connect the first ground plane with the second ground plane such that the return current passes between the first ground plane and the second ground plane through the ground via.

19. The method of claim 11, wherein the electrical signal is a differential signal including a first signal and a second signal, the method further comprising:
configuring the signal path as a differential signal path that includes a first-signal path configured to carry the first signal and a second-signal path configured to carry the second signal; and
configuring the first-signal path and the second-signal path to converge and diverge.

20. The method of claim 19, further comprising configuring at least one of the first-signal path and the second-signal path to narrow as the first-signal path and the second-signal path converge.

* * * * *